United States Patent
Kouno

(10) Patent No.: US 12,363,944 B2
(45) Date of Patent: Jul. 15, 2025

(54) SEMICONDUCTOR DEVICE

(71) Applicant: DENSO CORPORATION, Kariya (JP)

(72) Inventor: Kenji Kouno, Kariya (JP)

(73) Assignee: DENSO CORPORATION, Kariya (JP)

( * ) Notice: Subject to any disclaimer, the term of this patent is extended or adjusted under 35 U.S.C. 154(b) by 582 days.

(21) Appl. No.: 17/688,224

(22) Filed: Mar. 7, 2022

(65) Prior Publication Data

US 2022/0190155 A1  Jun. 16, 2022

Related U.S. Application Data

(63) Continuation of application No. PCT/JP2020/034496, filed on Sep. 11, 2020.

(30) Foreign Application Priority Data

Sep. 17, 2019  (JP) .................... 2019-168543

(51) Int. Cl.
*H10D 30/66* (2025.01)
*H10D 62/17* (2025.01)
*H10D 64/00* (2025.01)

(52) U.S. Cl.
CPC ......... *H10D 30/668* (2025.01); *H10D 62/393* (2025.01); *H10D 64/117* (2025.01)

(58) Field of Classification Search
CPC ............. H01L 29/7813; H01L 29/1095; H01L 29/407; H01L 29/0696; H01L 29/8083; H01L 29/42356; H01L 29/0684; H01L 29/7827
See application file for complete search history.

(56) References Cited

U.S. PATENT DOCUMENTS

| | | | | | |
|---|---|---|---|---|---|
| 8,076,719 | B2 * | 12/2011 | Zeng | ............ | H01L 29/7813 257/334 |
| 2002/0175380 | A1 * | 11/2002 | Shirahata | ............ | H01L 27/092 257/E21.639 |
| 2006/0214197 | A1 * | 9/2006 | Nakamura | ............ | H01L 29/7813 257/E29.136 |

OTHER PUBLICATIONS

Syotaro Ono, Yoshihiro Yamaguchi, Yusuke Kawaguchi, and Akio Nakagawa, "30V Sub-micron Shallow Junction Planar-MOSFET for DC-DC Converters", Proceedings of 2004 International Symposium on Power Semiconductor Devices & ICs, 2004, p. 401-404, , Kitakyushu, Japan.

(Continued)

*Primary Examiner* — Syed I Gheyas
(74) *Attorney, Agent, or Firm* — Posz Law Group, PLC

(57) ABSTRACT

A semiconductor device includes a source electrode, a drain electrode and a gate. The gate controls a current flowing between the source electrode and the drain electrode. Capacitance between the gate and the drain electrode is first capacitance. Capacitance between the gate and the source electrode is second capacitance. A sum of the first capacitance and the second capacitance is equal to third capacitance. Total switching loss is a sum of first switching loss and second switching loss. The first switching loss is defined by a current variation rate, and the second switching loss is defined by a voltage variation rate. A capacitance ratio of the first capacitance to the third capacitance is set to a ratio to satisfying a relationship that the total switching loss is smaller than a predetermined value.

4 Claims, 4 Drawing Sheets

(56) References Cited

OTHER PUBLICATIONS

Zia Hossain, Bhavani Burra, James Sellers, Brian Pratt, Prasad Venkatraman, Gary Loechelt, Ali Salih "Process & Design Impact on BVDSS Stability of a Shielded Gate Trench Power MOSFET", Proceedings of the 26th International Symposium on Power Semiconductor Devices & IC's, Jun. 15-19, 2014, p. 378-381, Waikoloa, Hawaii.

Shinsuke Harada, Makoto Kato, Takahito Kojima, Keiko Ariyoshi, Yasunori Tanaka, Hajime Okumura "Determination of optimum structure of 4H—SiC Trench MOSFET", Proceedings of the 2012 24th International Symposium on Power Semiconductor Devices and Ics, Jun. 3-7, 2012, p. 253-256, Bruges, Belgium.

\* cited by examiner

SEMICONDUCTOR DEVICE

CROSS REFERENCE TO RELATED APPLICATIONS

The present application is a continuation application of International Patent Application No. PCT/JP2020/034496 filed on Sep. 11, 2020, which designated the U.S. and claims the benefit of priority from Japanese Patent Application No. 2019-168543 filed on Sep. 17, 2019. The entire disclosures of all of the above applications are incorporated herein by reference.

TECHNICAL FIELD

The present disclosure relates to a semiconductor device.

BACKGROUND

A semiconductor device provided with a gate may include an insulated gate bipolar transistor (IGBT) as a switching element adopted in, for example, a DC/DC converter.

SUMMARY

The present disclosure describes a semiconductor device including a gate, a source electrode and a drain electrode.

BRIEF DESCRIPTION OF DRAWINGS

Objects, features and advantages of the present disclosure will become more apparent from the following detailed description made with reference to the accompanying drawings. In the drawings.

DETAILED DESCRIPTION

A semiconductor device may include a gate, a source and a drain. The semiconductor device may reduce switching loss by reducing a Miller charge Qgd.

However, in the semiconductor device described above, in a case where the Miller charge Qgd is reduced, a time during which a drain voltage varies may be shorter since a Miller time becomes shorter. In the semiconductor device described above, as the time during the drain voltage varies becomes shorter, a voltage surge denoting dV/dt becomes larger. Therefore, in a case where the semiconductor device is incorporated into a system included in, for example, an inverter, a fault may occur at the system that is caused by noise or the voltage surge.

According to an aspect of the present disclosure, a semiconductor device includes a source electrode, a drain electrode and a gate. The gate controls a current flowing between the source electrode and the drain electrode. Capacitance between the gate and the drain electrode is first capacitance. Capacitance between the gate and the source electrode is second capacitance. A sum of the first capacitance and the second capacitance is equal to third capacitance. Total switching loss is a sum of first switching loss and second switching loss. The first switching loss is defined by a rate of variation in the current, and the second switching loss is defined by a rate of variation in a voltage. A capacitance ratio of the first capacitance to the third capacitance is set to a ratio to satisfy a relationship that the total switching loss is smaller than a predetermined value.

Since the total switching loss is less than or equal to a predetermined amount, it is possible to reduce the switching loss while inhibiting the occurrence of a fault in the system in a case where the semiconductor device is incorporated into a system included in, for example, the inverter.

The following describes multiple embodiments with reference to the drawings. Hereinafter, in the respective embodiments, substantially the same configurations are denoted by identical symbols, and repetitive description will be omitted.

First Embodiment

A semiconductor device according to a first embodiment will be described with reference to the drawings. A semiconductor device according to the present embodiment may be adopted as a power switching element used in power supply circuits such as inverters and DC/DC converters, for example.

Figure 1:
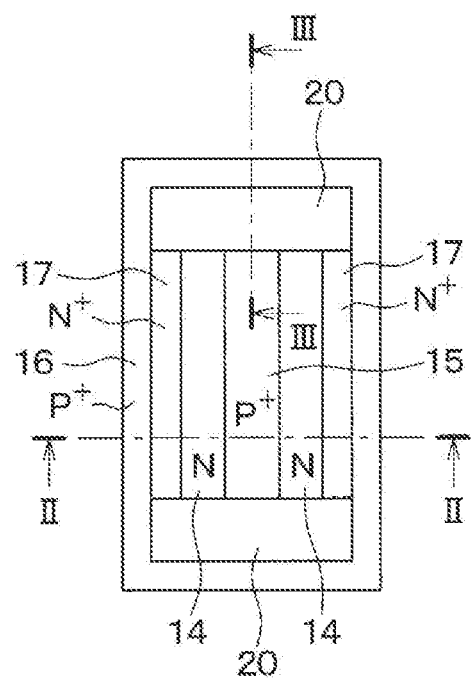
FIG. 1 is a plan view of a semiconductor device according to a first embodiment.
Figure 2:
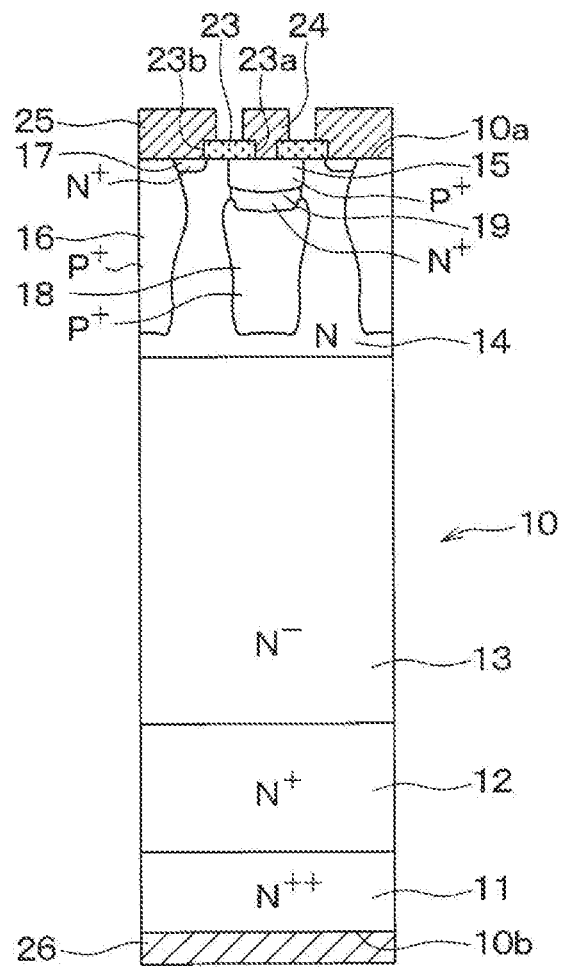
FIG. 2 is a cross-sectional view of the semiconductor device taken along a line II-II shown in FIG. 1.

The following describes the structure of a semiconductor device in which a junction type field effect transistor (hereinafter referred to as JFET) according to the present embodiment. First, the configuration of the semiconductor device according to the present embodiment will be described with reference to FIGS. 1 to 3. FIG. 1 is a plan view that illustrates one cell portion of the JFET, and the semiconductor device has multiple cells arranged to be adjacent to each other. FIG. 1 omits the illustration of, for example, an interlayer insulation film 23, a gate electrode 24 and a source electrode 25.

The semiconductor device includes a semiconductor substrate 10 having a drain layer 11 and formed of an $N^{++}$ type silicon carbide (hereinafter also referred to as "SiC") substrate. Then, an $N^+$ type buffer layer 12 having an impurity concentration lower than that of the drain layer 11 is disposed on the drain layer 11, and an $N^-$ type drift layer 13 having an impurity concentration lower than that of the buffer layer 12 is disposed on the buffer layer 12. The buffer layer 12 and the drift layer 13 are formed, for example, by growing an epitaxial film made of SiC on the SiC substrate forming the drain layer 11.

An N type channel layer 14 having a higher impurity concentration than the drift layer 13 is disposed on the drift layer 13. The channel layer 14 is formed by growing, for example, an epitaxial film of SiC. In the present embodiment, the semiconductor substrate 10 has one surface 10a including the surface of the channel layer 14.

Furthermore, a $P^+$ type gate layer 16 and a $P^+$ type body layer 17, which are higher in impurity concentration than the channel layer 14, are formed at the channel layer 14. In the present embodiment, the body layer 16 is formed in a quadrilateral shape having a first direction as a longitudinal direction in a plan view of the one-cell region. In FIG. 1, it is formed in a quadrilateral shape having a vertical direction as viewed on the drawing paper of FIG. 1 as the longitudinal direction. The gate layer 15 has a rectangular shape with the longitudinal direction of the body layer 16 as the longitudinal direction in a plan view of the one-cell region, and is disposed within the body layer 16 while being disposed away from the body layer 16. In the present embodiment, the gate layer 15 corresponds to a gate.

In a situation where the thickness direction of the semiconductor substrate 10 is defined as the depth direction, the gate layer 15 and the body layer 16 are formed along the depth direction from the one surface 10a of the semiconductor substrate 10, in other words, from the surface of the channel layer 14. The body layer 16 is formed to be deeper than the gate layer 15. In other words, the depth direction of the semiconductor substrate 10 may also be referred to as the stacking direction of the drain layer 11, the drift layer 13 and the channel layer 14.

Further, at the surface layer portion of the channel layer 14, an $N^+$ type source layer 17 having a higher impurity concentration than the channel layer 14 is formed so as to be in contact with the body layer 16.

A shield layer 18 is formed at the channel layer 14 such that the shield layer 18 is formed to at a position deeper than the gate layer 15 while being separated from the gate layer 15 and facing the gate layer 15. In other words, the shield layer 18 facing the gate layer 15 is formed at a part of the channel layer 14 located between the gate layer 15 and the drift layer 13.

In the present embodiment, the shield layer 18 is formed as the $P^+$ type with the impurity concentration identical to the body layer 16, and is formed as a rectangular shape along the longitudinal direction of the gate layer 15 in a plan view. The length of the shield layer 18 in the longitudinal direction is longer than the length of the gate layer 15 in the longitudinal direction. The shield layer 18 is electrically connected to the body layer 16 by connecting the both end portion of the shield layer 18 to the body layer 16. That is, the shield layer 18 of the present embodiment has a potential identical to the potential of the body layer 16. In the present embodiment, the shield layer 18 is thus maintained at a potential different from the potential of the gate layer 15.

An $N^+$ type separating layer 19 is formed at the channel layer 14 between the gate layer 15 and the shield layer 18. The separating layer 19 electrically isolates the gate layer 15 and the shield layer 18, and has a higher impurity concentration than the channel layer 14.

Figure 3:
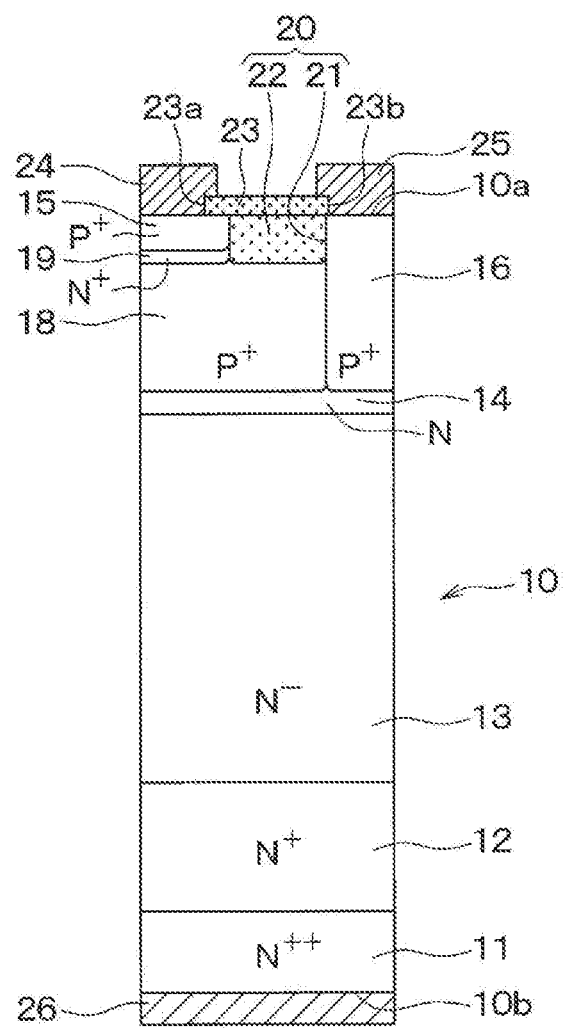
FIG. 3 is a cross-sectional view of the semiconductor device taken along a line III-III shown in FIG. 1.

In the present embodiment, a shallow trench isolation (STI) separating portion 20 is formed at a surface layer portion of the channel layer 14, as shown in FIGS. 1 and 3. The STI separating portion 20 electrically separates the gate layer 15 and the body layer 16. Specifically, the STI separating portion 20 is formed between the gate layer 15 and the body layer 16, at each of opposite ends of the gate layer 15 in the longitudinal direction. In the present embodiment, the STI separating portion 20 is provided by an insulating film 22 embedded in a trench 21 having a predetermined depth.

The interlayer insulation film 23 is formed above the one surface 10a of the semiconductor substrate 10. The interlayer insulation film 23 is formed with a first contact hole 23a for exposing the gate layer 15 and a second contact hole 23b for exposing the body layer 16 and the source layer 17. On the interlayer insulation film 23, the gate electrode 20 is arranged to be electrically connected with the gate layer 15 through a first contact hole 19a. A source electrode 25 electrically connected to the body layer 16 and the source layer 17 through the second contact hole 23b is formed on the interlayer insulation film 23.

A drain electrode 26 that is electrically connected to the drain layer 11 is formed on the other surface 10b side of the semiconductor substrate 10.

The configuration of the semiconductor device according to the present embodiment has been described above. In the present embodiment, $N^-$ type, N type, $N^+$ type and $N+^+$ type correspond to the first conductivity type, and $P^+$ type corresponds to the second conductivity type. Further, in the present embodiment, as described above, the semiconductor substrate 10 includes the drain layer 11, the buffer layer 12, the drift layer 13, the channel layer 14, the gate layer 15, the body layer 16 and the source layer 17. Further, in the present embodiment, as described above, the drain layer 11 is formed of a silicon carbide (SiC) substrate, and the buffer layer 12, the drift layer 13, the channel layer 14 and the like are formed by growing an epitaxial film made of SiC. Therefore, the semiconductor device of the present embodiment may be defined as a SiC semiconductor device.

The following describes the relationship between the gate layer 15 and the shield layer 18 in the present embodiment. In the following, the capacitance between the gate layer and the drain layer may also be regarded as first capacitance Cgd, the capacitance between the gate layer and the source electrode may also be regarded as second capacitance Cgs. The sum of the first capacitance Cgd and the first capacitance Cgd and the second capacitance Cgs (in other words, Cgd+Cgs) may also be regarded as third capacitance Ciss. The first capacitance corresponds to Miller capacitance, and the third capacitance corresponds to input capacitance.

Figure 4:
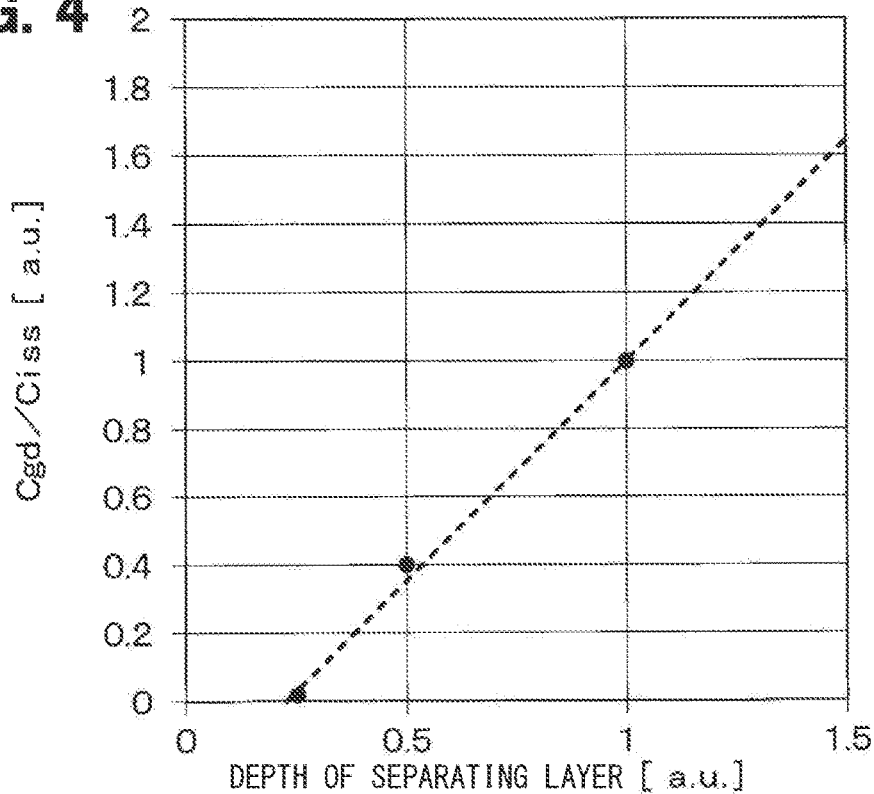
FIG. 4 illustrates a simulation result showing the relationship between the depth of a separating layer and a capacitance ratio.

The ratio of the first capacitance Cgd to the third capacitance Ciss may also be regarded as a capacitance ratio Cgd/Ciss, which is simply referred to as the capacitance ratio in the following. In this case, when the length between the one surface 10a of the semiconductor substrate 10 and the bottom surface of the shield layer 18 and the distance between the gate layer 15 and the shield layer 18 are constant, the capacitance ratio changes according to variation of the depth of the separating layer 19 as shown in FIG. 4. It is confirmed that the separating layer 19 is formed deeper as the capacitance ratio is larger. In other words, it is confirmed that the gate layer 15 is formed deeper as the capacitance ratio is larger. In such a semiconductor device, it is possible to easily change the capacitance ratio by, for example, changing the depth of the gate layer 15.

Figure 5:
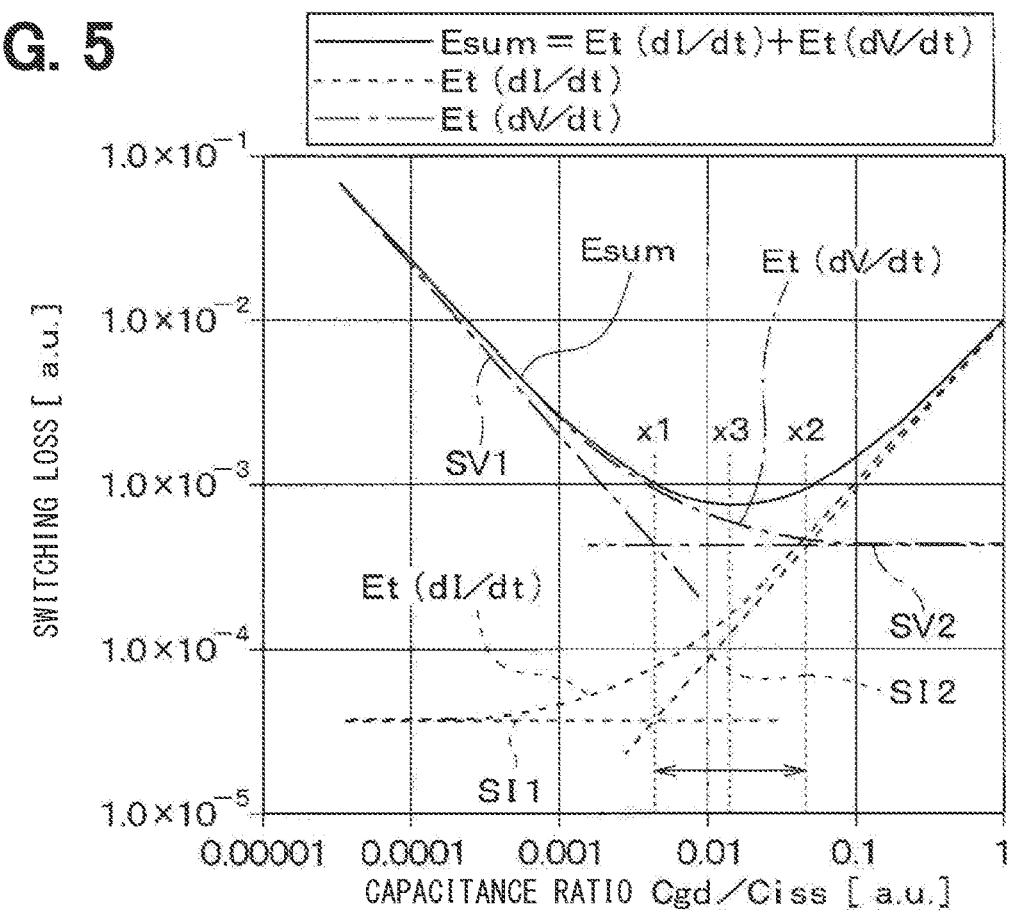
FIG. 5 illustrates the relationship between the capacitance ratio and switching loss.

The inventor in the present application obtained the result shown in FIG. 5 by reviewing the relationship between the capacitance ratio and the switching loss. The inventor in the present application reviewed the relationship between the capacitance ratio and switching loss Et (dI/dt). The switching loss Et (dI/dt) is defined by a current variation rate dI/dt. In the following, the current variation rate dI/dt is simply referred to as dI/dt. The inventor in the present application reviewed the relationship between the capacitance ratio and switching loss Et (dV/dt). The switching loss Et (dV/dt) is defined by a voltage variation rate dV/dt. In the following, the voltage variation rate dV/dt is simply referred to as dV/dt. Furthermore, the inventor in the present application studied the relationship between the capacitance ratio and the total switching loss Esum. The total switching loss Esum is the sum of the switching loss Et (dI/dt) and the switching loss Et (dV/dt). In other words, Esum=Et (dI/dt)+Et (dV/dt).

dI/dt corresponds to a self surge. dV/dt corresponds to a system surge. The system surge may be, for example, a motor surge that may occur in a system such as an inverter circuit. In the present embodiment, the switching loss Et (dI/dt) defined by the dI/dt corresponds to first switching loss. Similarly, the switching loss Et (dV/dt) defined by dV/dt corresponds to second switching loss.

The following describes each switching loss. In the semiconductor device, the current flowing between the source electrode 25 and the drain electrode 26 is controlled by a voltage applied to the gate layer 15. In the following, a change from a situation in which the current flows in the semiconductor to a situation in which the current is cut off in the semiconductor device may be referred to as turn-off of the semiconductor device, and a change from a situation in which the current does not flow in the semiconductor device to a situation in which the current flows in the semiconductor device may be referred to as turn-on of the semiconductor device. In the following, Vd denotes a power supply voltage, Id denotes an operating current, toff denotes a turn-off time or turn-off time duration, Rg denotes a gate resistance, Vm denotes a gate Miller electric potential, Vth denotes a gate threshold voltage, ton denotes a turn-on time or a turn-on time duration, and Vg denotes a gate drive voltage.

dI/dt at the turn-off of the semiconductor device is indicated by the following mathematical formula 1.

$$dI/dt = Id/\text{toff} \qquad \text{[Mathematical Formula 1]}$$

The term toff in the mathematical formula 1 is indicated by the following mathematical formula 2.

$$\text{toff} = Rg \times Ciss \times \ln(Vm/Vth) \qquad \text{[Mathematical Formula 2]}$$

Similarly, dV/dt at the turn-off of the semiconductor device is indicated by the following mathematical formula 3.

$$dV/dt = Vd/tm \qquad \text{[Mathematical Formula 3]}$$

The term tm in the mathematical formula 3 is indicated by the mathematical formula 4.

$$tm = (Rg \times Cgd \times Vd)/Vm \qquad \text{[Mathematical Formula 4]}$$

dI/dt at the turn-on of the semiconductor device is indicated by the following mathematical formula 5.

$$dI/dt = Id/\text{ton} \qquad \text{[Mathematical Formula 5]}$$

The term ton in the mathematical formula 5 is indicated by the following mathematical formula 6.

$$\text{ton} = Rg \times Ciss \times \ln[(Vg-Vth)/(Vg-Vm)] \qquad \text{[Mathematical Formula 6]}$$

Similarly, dV/dt at the turn-on of the semiconductor device is indicated by the following mathematical formula 7.

$$dV/dt = Vd/tm \qquad \text{[Mathematical Formula 7]}$$

The term tm in the mathematical formula 7 is indicated by the mathematical formula 8.

$$tm = (Vd \times Rg \times Cgd)/(Vg-Vm) \qquad \text{[Mathematical Formula 8]}$$

Eon denotes the switching-off loss at the turn-off of the semiconductor device, Eoff denotes the switching-on loss at the turn-on of the semiconductor device, and Err denotes recovery loss. In this case, the switching loss Et (dI/dt) defined by dI/dt is indicated by the following mathematical formula 9.

$$Et(dI/dt) = Eon + Eoff + Err \qquad \text{[Mathematical Formula 9]}$$

Eon and Eoff of the switching loss Et (dI/dt) are respectively indicated by the following mathematical formulae 10 and 11.

$$Eoff = Vd \times Id^2 \times [0.5+(Cgd \times Vd)/(2 \times Vm \times Ciss)/\ln(Vm/Vth)]/(dI/dt) \qquad \text{[Mathematical Formula 10]}$$

$$Eon = Vd \times Id^2 \times [0.5+(Vd \times Cgd)/2(Vg-Vm) \times Ciss]/\ln[(Vg-Vth)/(Vg-Vm)]/(dI/dt) \qquad \text{[Mathematical Formula 11]}$$

Since the recovery loss Err is sufficiently small as compared with Eon and Eoff and may be neglected. Similarly, the switching loss Et (dV/dt) defined by dV/dt is indicated by the following mathematical formula 12.

$$Et(dV/dt) = Eon + Eoff + Err \qquad \text{[Mathematical Formula 12]}$$

In this case, Eon and Eoff of the switching loss Et (dV/dt) are respectively indicated by the following mathematical formulae 13 and 14.

$$Eoff = Vd \times Id \times [(Vm/2/Cgd) \times Ciss \times \ln(Vm/Vth) + Vd/2]/(dV/dt) \qquad \text{[Mathematical Formula 13]}$$

$$Eon = Vd \times Id \times [(Ciss/2) \times \ln[(Vg-Vth)/(Vg-Vm)] \times (Vg-V)/Cgd+Vd/2]/(dV/dt) \qquad \text{[Mathematical Formula 14]}$$

As shown in FIG. 5, it is confirmed that the switching loss Et (dV/dt) becomes smaller as the capacitance ratio becomes larger, and it is confirmed that the switching loss Et (dI/dt) becomes larger as the capacitance ratio becomes larger. In other words, the relationship between the switching loss Et (dV/dt) and the switching loss Et (dI/dt) corresponding to the capacitance ratio is reversed. The semiconductor device may be configured such that both of the switching loss Et (dV/dt) and the switching loss Et (dI/dt) are commonly small. In other words, the semiconductor device may be configured to decrease the total switching loss Esum. For this reason, the semiconductor device in the present embodiment may be configured such that the total switching loss Esum is less than a predetermined threshold value. In particular, the semiconductor device in the present embodiment is configured to satisfy the following value.

The capacitance ratio corresponding to an intersection point x1 of two tangent lines SI1, SI2 of the switching loss Et(dI/dt) and an intersection point x1 of two tangent lines SV1, SV2 of the switching loss Et(dV/dt) is indicated by the following mathematical formula 15 based on the above-described mathematical formulae 1 to 14.

$$Cgd/Ciss = x1 = Id/(gm \times Vd) \qquad \text{[Mathematical Formula 15]}$$

In the mathematical formula 15, the term gm is equal to Id/(Vm−Vth), and is identical in the following formula. The tangent line SI1 is a tangent line where the absolute value of the slope of the switching loss Et (dI/dt) is at the minimum, and the tangent line SI2 is a tangent line where the absolute value of the slope of the switching loss Et (dI/dt) is at the maximum. The tangent line SV1 is a tangent line where the absolute value of the slope of the switching loss Et (dV/dt) is at the maximum, and the tangent line SV2 is a tangent line where the absolute value of the slope of the switching loss Et (dV/dt) is at the minimum.

The intersection point x2 of the switching loss Et (dI/dt) and the switching loss Et (dV/dt) is Et (dI/dt)=Et (dV/dt). The capacitance ratio corresponding to the intersection point x2 is indicated by the following mathematical formula 16 based on the above mathematical formulae 1 to 14.

$$Cgd/Ciss = x2 = dI/dt/(gm \times dV/dt) \qquad \text{[Mathematical Formula 16]}$$

The semiconductor device in the present embodiment has the capacitance ratio satisfying the mathematical formula 15 or being larger than a right-hand side of the mathematical formula 15, and has the capacitance ratio satisfying the mathematical formula 16 or being smaller than a right-hand side of the mathematical formula 16. For example, as described with reference to FIG. 4, by changing the depth relationship between the gate layer 15 and the shield layer 18, the capacitance ratio satisfies the mathematical formula 14 or is larger than a right-hand side of the mathematical formula 14, and satisfies the mathematical formula 15 or is smaller than a right-hand side of the mathematical formula 15. Therefore, the semiconductor device has reduced switching loss Et (dI/dt) and reduced switching loss Et (dV/dt).

In this case, a minimum value x3 of the total switching loss Esum is indicated by mathematical formula 17 based on the mathematical formulae 1 to 14.

$$Cgd/Ciss = x3 = 1/gm \times [(Id/Vd) \times (dI/dt)/(dV/dt)]^{1/2}$$ [Mathematical Formula 17]

Therefore, it is possible for the semiconductor device to mostly reduce the total switching loss Esum with the capacitance ratio satisfying the mathematical formula 17. In addition, the square of the value of x3 is equal to the value corresponding to the intersection point x1 multiplied by the value corresponding to the intersection point x2.

As described above, in the present embodiment, the capacitance ratio satisfies the mathematical formula 15 or is larger than a right-hand side of the mathematical formula 15, and satisfies the mathematical formula 16 or is smaller than a right-hand side of the mathematical formula 16. Thus, the total switching loss Esum can be reduced, it is possible reduce the switching loss while inhibiting the occurrence of a fault in the system in a case where the semiconductor device is incorporated into a system included in, for example, the inverter.

Second Embodiment

A second embodiment will be described. In the present embodiment, as different from the above first embodiment, a semiconductor device formed with a MOSFET is adopted. Other configurations are the same as those of the first embodiment, and therefore a description of the same configurations will be omitted.

Figure 6:
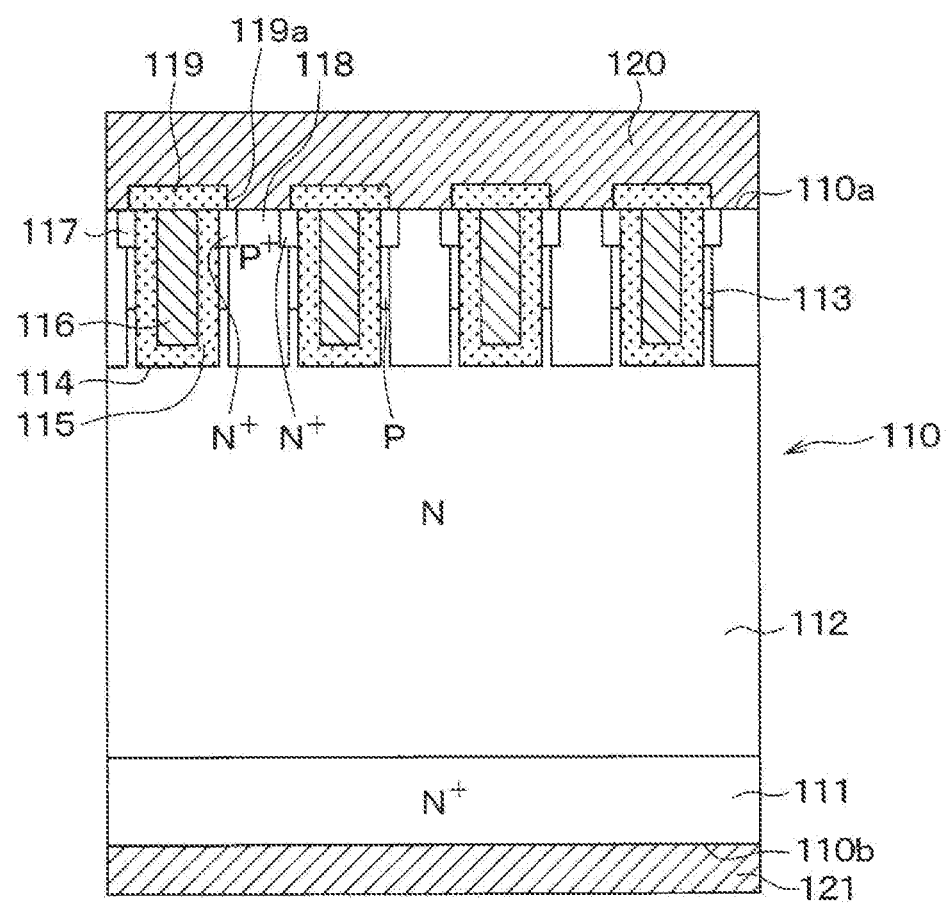
FIG. 6 is a cross-sectional view of a semiconductor device according to a second embodiment.

The semiconductor device according to the present embodiment includes a semiconductor substrate 110 having a drain layer 111 made of an $N^+$ type substrate, as illustrated in FIG. 6. On the drain layer 111, an $N^-$ type drift layer 112 having a lower impurity concentration than the drain layer 111 is disposed. A P type channel layer 113 having a higher impurity concentration than the drift layer 112 is disposed on the drift layer 112.

In addition, trenches 114 are formed in the semiconductor substrate 110 so as to penetrate the channel layer 113 and reach the drift layer 112, and the channel layer 113 is separated into several portions by the trenches 114. In the present embodiment, the trenches 114 are formed at regular intervals in a stripe manner along one direction of a surface direction of the one surface 110a of the semiconductor substrate 110 (that is, a direction in a paper depth direction in FIG. 6). Note that the trenches 114 may have an annular structure by bending the tip portions thereof.

In each trench 114, a gate insulation film 115 formed to cover an inner wall surface of each trench 114, and a gate electrode 16 formed of polysilicon or the like formed on the gate insulation film 115 are embedded. Accordingly, a trench gate structure is formed.

In the channel layer 113, an $N^+$ type source layer 117 and a $P^+$ type contact layer 118 are formed so as to be sandwiched between the source layers 117. The source layer 117 is configured to have a higher impurity concentration than the drift layer 112 and being in contact with the side wall of the trench 114. The contact layer 118 has a higher impurity concentration than the channel layer 113.

To be more specific, the source layer 117 is extended in a bar manner to be in contact with a side wall of the trench 114 along the longitudinal direction of the trench 114 in a region between adjacent two of the trenches 114, and terminated inside a tip of the trench 114 in its structure. Further, the contact layer 118 is sandwiched between two source layers 117 and extends in a rod shape along the longitudinal direction of the trench 114 (that is, the source layer 117). The contact layer 118 is formed to a depth substantially identical to the depth of the trench 114.

An interlayer insulation film 119 is formed on the channel layer 113 (that is, one surface 110a of the semiconductor substrate 110). In the interlayer insulation film 119, a contact hole 119a exposing a part of the source layer 117 and the contact layer 118 is formed. On the interlayer insulation film 119, the source electrode 120 electrically connected to the source layer 117 and the contact layer 118 through the contact hole 119a is formed.

A drain electrode 21 that is electrically connected to the drain layer 111 is formed on the other surface 110b side of the semiconductor substrate 110.

The configuration of the semiconductor device according to the present embodiment has been described above. The semiconductor device satisfies the above capacitance ratio, in a case where the capacitance between the gate electrode 116 and the drain electrode 121 is regarded as the first capacitance Cgd, and the capacitance between the gate electrode 116 and the source electrode 120 is regarded as the second capacitance Cgs. In the semiconductor device according to the present embodiment, by setting the depth of the contact layer 118 substantially identical to the depth of the trench 114, the capacitance ratio satisfies the mathematical formula 15 or is larger than the right-hand side of the mathematical formula 15, and satisfies the mathematical formula 16 or is smaller than the right-hand side of the mathematical formula 16.

As described above, even in the semiconductor device formed with the MOSFET, it is possible to attain the advantageous effect identical to the effect in the first embodiment by satisfying the capacitance ratio in the first embodiment.

The mathematical formula described in the present description may also be referred to as mathematical relation or may also be simply referred to as a relation.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the scope and the scope of the present disclosure.

For example, in each of the above-described embodiments, the example is described in which the first conductive type is N type and the second conductive type is P type. Alternatively, the first conductive type may be P type and the second conductive type may be N type.

In the first embodiment, the semiconductor may adopt a silicon substrate or another compound semiconductor substrate. In the second embodiment, the semiconductor may adopt a silicon substrate or another compound semiconductor substrate.

The first embodiment describes an example of adjusting the depth relationship between the gate layer 15 and the shield layer 18 as a method for changing the capacitance ratio. However, the capacitance ratio may be changed by other methods. For example, the capacitance ratio may be modified by the impurity concentration of the body layer 16 and the impurity concentration of the shield layer 18.

Similarly, the second embodiment describes an example of adjusting the depth of the contact layer 118 as a method for changing the capacitance ratio. However, the capacitance ratio may be changed by other methods. For example, the capacitance ratio may be changed by forming a p type impurity layer between the gate electrode 116 and the drain electrode 121.

The second embodiment describes the trench gate type semiconductor device. However, the semiconductor device may be a planar gate type semiconductor device in which the gate electrode 116 is disposed above the one surface 110a of the semiconductor substrate 110.

What is claimed is:

1. A semiconductor device comprising:
a source electrode;
a drain electrode; and
a gate configured to control a current flowing between the source electrode and the drain electrode,
wherein capacitance between the gate and the drain electrode is first capacitance,
wherein capacitance between the gate and the source electrode is second capacitance,
wherein a sum of the first capacitance and the second capacitance is equal to third capacitance,
wherein total switching loss is a sum of first switching loss and second switching loss,
wherein the first switching loss is defined by a rate of variation in the current, and the second switching loss is defined by a rate of variation in a voltage, and
wherein a capacitance ratio of the first capacitance to the third capacitance is set to a ratio satisfying a relationship that the total switching loss is smaller than a predetermined value, and
wherein the capacitance ratio is set in a range from the following mathematical formula (1) to the following mathematical formula (2), inclusive:

$$Cgd/Ciss = Id/(gm \times Vd) \quad (1); \text{ and}$$

$$Cgd/Ciss = dI/dt/(gm \times dV/dt) \quad (2),$$

wherein Cgd denotes the first capacitance, Ciss denotes the third capacitance, Cgd/Ciss denotes the capacitance ratio, dI/dt denotes the rate of variation in the current, dV/dt denotes the rate of variation in the voltage, Vd denotes a power supply voltage, gm denotes a mathematical relation defining Id/(Vm−Vth), Vm in the mathematical relation denotes a Miller electric potential of the gate, Vth in the mathematical relation denotes a threshold voltage of the gate, and Id in the mathematical relation denotes an operating current.

2. The semiconductor device according to claim 1, wherein the capacitance ratio satisfies the following mathematical formula (3):

$$Cgd/Ciss = 1/gm \times \{(Id/Vd) \times (dI/dt)/(dV/dt)\}^{1/2} \quad (3).$$

3. The semiconductor device according to claim 1, further comprising:
a drift layer of a first conductivity type;
a channel layer of the first conductivity type disposed above the drift layer;
a source layer of the first conductivity type disposed at a surface layer portion of the channel layer and having a higher impurity concentration than the channel layer, the source layer configured to be electrically connected by the source electrode;
a gate layer of a second conductivity type configured as the gate, the gate layer disposed at the channel layer and being deeper than the source layer;
a drain layer of the first conductivity type disposed at a side opposed to the source layer with the drift layer interposed between the source layer and the drain layer, the drain layer configured to be electrically connected by the drain electrode; and
a shield layer disposed between the gate layer and the shield layer, the shield layer configured to be electrically connected by the source electrode,
wherein the gate layer and the shield layer are further configured to satisfy the capacitance ratio.

4. The semiconductor device according to claim 1, further comprising:
a drift layer of a first conductivity type;
a channel layer of a second conductivity type disposed above the drift layer, the channel layer configured to be electrically connected by the source electrode;
a source layer of the first conductivity type disposed at a surface layer portion of the channel layer and having a higher impurity concentration than the channel layer, the source layer configured to be electrically connected by the source electrode;
a gate insulation film disposed at a surface of the channel layer sandwiched between the source layer and the drift layer;
a gate electrode configured as the gate, the gate electrode disposed above the gate insulation film;
a drain layer of the first conductivity type disposed at a side opposed to the channel layer with the drift layer sandwiched between the channel layer and the drain layer, the drain layer configured to be electrically connected by the drain electrode; and
a contact layer of the second conductivity type disposed at the channel layer, the contact layer configured to be electrically connected by the source electrode at the surface layer of the channel layer,
wherein the gate electrode and the contact layer are further configured to satisfy the capacitance ratio.

* * * * *